(12) United States Patent
Zhang et al.

(10) Patent No.: US 10,770,387 B2
(45) Date of Patent: Sep. 8, 2020

(54) INTEGRATED CIRCUIT PACKAGE SUBSTRATE

(71) Applicant: INTEL CORPORATION, Santa Clara, CA (US)

(72) Inventors: Qinglei Zhang, Chandler, AZ (US); Stefanie M. Lotz, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/381,889

(22) Filed: Apr. 11, 2019

(65) Prior Publication Data

US 2019/0304892 A1 Oct. 3, 2019

Related U.S. Application Data

(60) Continuation of application No. 15/813,866, filed on Nov. 15, 2017, now Pat. No. 10,325,843, which is a
(Continued)

(51) Int. Cl.
*H01L 23/498* (2006.01)
*H01L 21/288* (2006.01)
(Continued)

(52) U.S. Cl.
CPC ........ *H01L 23/49838* (2013.01); *C23C 18/32* (2013.01); *C23C 18/42* (2013.01);
(Continued)

(58) Field of Classification Search
CPC ......... H01L 23/49838; H01L 23/49866; H01L 23/5381; H01L 23/5383; H01L 21/4853;
(Continued)

(56) References Cited

U.S. PATENT DOCUMENTS 5,847,998 A 12/1998 Van Buskirk
6,972,152 B2 12/2005 Taggert et al.
(Continued)

FOREIGN PATENT DOCUMENTS

CN 101930956 A 12/2010
CN 101331812 B 2/2011
(Continued)

OTHER PUBLICATIONS

International Search Report and Written Opinion dated Jul. 24, 2014 for PCT/US2013/065246, 13 pages.
(Continued)

*Primary Examiner* — Hsien Ming Lee
(74) *Attorney, Agent, or Firm* — Schwabe, Williamson & Wyatt, P.C.

(57) ABSTRACT

Embodiments of the present disclosure are directed towards techniques and configurations for dual surface finish package substrate assemblies. In one embodiment a method includes depositing a first lamination layer on a first side of a package substrate and a first surface finish on one or more electrical contacts disposed on a second side of the package substrate; removing the first lamination layer from the first side of the package substrate; depositing a second lamination layer on the second side of the package substrate and a second surface finish on the one or more electrical contacts disposed on the first side of the package substrate; and removing the second lamination layer from the second side of the package substrate. Other embodiments may be described and/or claimed.

20 Claims, 5 Drawing Sheets

Related U.S. Application Data continuation of application No. 15/260,099, filed on Sep. 8, 2016, now Pat. No. 9,831,169, which is a division of application No. 14/368,721, filed as application No. PCT/US2013/065246 on Oct. 16, 2013, now Pat. No. 9,508,636.

(51) Int. Cl.
  *H01L 23/50* (2006.01)
  *H01L 23/538* (2006.01)
  *H01L 23/00* (2006.01)
  *H01L 21/48* (2006.01)
  *C23C 18/32* (2006.01)
  *C23C 18/42* (2006.01)

(52) U.S. Cl.
  CPC ........ *H01L 21/288* (2013.01); *H01L 21/4853* (2013.01); *H01L 23/49822* (2013.01); *H01L 23/49866* (2013.01); *H01L 23/49894* (2013.01); *H01L 23/50* (2013.01); *H01L 23/5381* (2013.01); *H01L 23/5383* (2013.01); *H01L 24/16* (2013.01); *H01L 24/81* (2013.01); *H01L 21/4857* (2013.01); *H01L 24/13* (2013.01); *H01L 2224/131* (2013.01); *H01L 2224/13101* (2013.01); *H01L 2224/16225* (2013.01); *H01L 2224/16227* (2013.01); *H01L 2224/32225* (2013.01); *H01L 2224/48227* (2013.01); *H01L 2224/73204* (2013.01); *H01L 2224/73265* (2013.01); *H01L 2224/81125* (2013.01); *H01L 2224/81801* (2013.01); *H01L 2224/81815* (2013.01); *H01L 2224/92125* (2013.01); *H01L 2924/1433* (2013.01); *H01L 2924/1434* (2013.01); *H01L 2924/15192* (2013.01); *H01L 2924/15311* (2013.01); *H01L 2924/181* (2013.01)

(58) Field of Classification Search
  CPC ..... H01L 21/4857; H01L 24/13; H01L 24/16; H01L 24/81; H01L 2224/131; H01L 2224/16227; H01L 2224/48227; H01L 2224/3204; H01L 2224/73265; H01L 2224/81125; H01L 2224/92125
  See application file for complete search history.

(56) References Cited

U.S. PATENT DOCUMENTS

| | | | |
|---|---|---|---|
| 8,064,224 | B2 | 11/2011 | Mahajan et al. |
| 8,127,979 | B1 | 3/2012 | Wu et al. |
| 8,441,809 | B2 | 5/2013 | Mahajan et al. |
| 8,519,543 | B1 | 8/2013 | Song et al. |
| 8,878,354 | B1 | 11/2014 | Patel |
| 9,275,955 | B2 | 3/2016 | Mahajan et al. |
| 2004/0178488 | A1 | 9/2004 | Bolken et al. |
| 2005/0211465 | A1 | 9/2005 | Sunohara et al. |
| 2006/0220167 | A1 | 10/2006 | Min et al. |
| 2006/0226527 | A1 | 10/2006 | Hatano et al. |
| 2007/0023910 | A1 | 2/2007 | Beddingfield |
| 2007/0023921 | A1 | 2/2007 | Zingher et al. |
| 2007/0096292 | A1 | 5/2007 | Machida |
| 2008/0210459 | A1 | 9/2008 | Lin |
| 2009/0089466 | A1 | 4/2009 | Cunningham et al. |
| 2009/0244874 | A1 | 10/2009 | Mahajan et al. |
| 2009/0321939 | A1 | 12/2009 | Chandrasekaran |
| 2010/0088452 | A1 | 4/2010 | Morein et al. |
| 2010/0101849 | A1 | 4/2010 | Sunohara et al. |
| 2010/0288541 | A1 | 11/2010 | Appelt et al. |
| 2010/0288549 | A1 | 11/2010 | Chiang et al. |
| 2010/0327424 | A1 | 12/2010 | Braunisch et al. |
| 2011/0147933 | A1 | 6/2011 | Wu et al. |
| 2011/0215472 | A1 | 9/2011 | Chandrasekaran |
| 2011/0042824 | A1 | 11/2011 | Koide |
| 2012/0193812 | A1 | 8/2012 | Toh et al. |
| 2013/0003309 | A1 | 1/2013 | Stella |
| 2013/0168854 | A1 | 7/2013 | Karikalan et al. |
| 2013/0168860 | A1 | 7/2013 | Karikalan et al. |
| 2013/0277855 | A1 | 10/2013 | Kang et al. |
| 2013/0320547 | A1 | 12/2013 | Zhang et al. |
| 2013/0320565 | A1 | 12/2013 | Griswold |
| 2014/0091474 | A1 | 4/2014 | Starkston et al. |
| 2014/0145331 | A1 | 5/2014 | Hwang et al. |
| 2014/0177625 | A1 | 6/2014 | Chang et al. |
| 2014/0189227 | A1 | 7/2014 | Choi |
| 2014/0210097 | A1 | 7/2014 | Chen et al. |
| 2014/0321087 | A1* | 10/2014 | Zhang ............... H01L 23/13 361/767 |
| 2015/0048515 | A1* | 2/2015 | Zhang ............... H01L 23/5381 257/774 |
| 2015/0116965 | A1 | 4/2015 | Kim et al. |
| 2016/0155705 | A1 | 6/2016 | Mahajan et al. |
| 2017/0301625 | A1 | 10/2017 | Mahajan et al. |

FOREIGN PATENT DOCUMENTS

| | | |
|---|---|---|
| CN | 102148206 A | 8/2011 |
| CN | 103378017 A | 10/2013 |
| JP | 2003008228 A | 1/2003 |
| JP | 2005163153 A | 6/2005 |
| JP | 2005213600 A | 8/2005 |
| JP | 2010219530 A | 9/2010 |
| JP | 2013105908 A | 5/2013 |
| JP | 2013110443 A | 6/2013 |
| JP | 2013138115 A | 7/2013 |
| KR | 1020130112084 A | 10/2013 |
| WO | 2013095405 A1 | 6/2013 |

OTHER PUBLICATIONS

Examination Report dated Apr. 22, 2015 for United Kingdom Application No. GB1420296.4, 6 pages.
Non-Final Office Action dated Jun. 11, 2015 for U.S. Appl. No. 14/132,774, 18 pages.
Examination Report dated Oct. 30, 2015 for United Kingdom Application No. GB1420296.4, 2 pages.
Notice of Allowance dated Nov. 4, 2015 for U.S. Application No. 14/132,774, 17 pages.
Examination Report dated Jan. 29, 2016 for United Kingdom Application No. GB1420296.4, 2 pages.
Examination Report dated Aug. 16, 2016 for United Kingdom Application No. GB1420296.4, 2 pages.
Non-Final Office Action dated Aug. 23, 2016 for U.S. Appl. No. 15/004,774, 24 pages.
Non-Final Office Action dated Mar. 1, 2016 for U.S. Appl. No. 14/368,721, 15 pages.
Notice of Allowance dated Jun. 20, 2016 for U.S. Appl. No. 14/368,721, 10 pages.
Office Action dated Sep. 8, 2016 for Korean Application No. 2016-7006749, 15 pages.
Notice of Allowance dated Mar. 17, 2017 for U.S. Appl. No. 15/004,774, 11 pages.
Extended European Search Report dated Apr. 21, 2017 for European Patent Application No. 13895610.7, 7 pages.
Non-Final Office Action dated Nov. 14, 2017 for U.S. Appl. No. 15/636,117, 33 pages.
Office Action dated Dec. 7, 2017 for Japanese Application No. 2016-545727, 14 pages.
Final Office Action dated Dec. 27, 2016 for U.S. Appl. No. 15/004,774, 27 pages.
Non-Final Office Action dated Apr. 17, 2017 for U.S. Appl. No. 15/260,099, 25 pages.
Notice of Allowance dated Aug. 2, 2017 for U.S. Appl. No. 15/260,099, 19 pages.
Office Action dated Jul. 13, 2018 for Japanese Application No. 2016-545727, 11 pages.

(56) References Cited

OTHER PUBLICATIONS

Notice of Allowance dated May 14, 2018 for U.S. Appl. No. 15/636,117, 20 pages.
Office Action dated Jan. 17, 2019 for Japanese Application No. 2016-545727, 17 pages.
Non-Final Office Action dated May 31, 2018 for U.S. Appl. No. 15/813,866, 26 pages.
Ex Parte Quayle Action mailed Sep. 18, 2018, 2018 for U.S. Appl. No. 15/813,866, 9 pages.
Notice of Allowance dated Feb. 11, 2019, for U.S. Appl. No. 151813,866, 12 pages.
Notice of Allowance dated Mar. 25, 2019, for U.S. Appl. No. 15/813,866, 8 pages.
Office Action dated Nov. 26, 2019 for European Patent Application No. 13895610.7, 4 pages.
Office Action dated Jan. 14, 2020 for Japanese Patent Application No. 2016-545727, 28 pages.

* cited by examiner

INTEGRATED CIRCUIT PACKAGE SUBSTRATE

CROSS REFERENCE TO RELATED APPLICATIONS

The present application is a continuation of U.S. application Ser. No. 15/813,866, filed Nov. 15, 2017, entitled "INTEGRATED CIRCUIT PACKAGE SUBSTRATE", which is a continuation of U.S. application Ser. No. 15/260,099, filed Sep. 8, 2016, entitled "INTEGRATED CIRCUIT PACKAGE SUBSTRATE", now U.S. Pat. No. 9,831,169, which is a divisional of U.S. application Ser. No. 14/368,721, filed Jun. 25, 2014, entitled "INTEGRATED CIRCUIT PACKAGE SUBSTRATE", now U.S. Pat. No. 9,508,636, issued Nov. 29, 2016, which is a national phase entry under 35 U.S.C. § 371 of International Application No. PCT/US2013/065246, filed Oct. 16, 2013, entitled "INTEGRATED CIRCUIT PACKAGE SUBSTRATE", which designated, among the various States, the United States of America. The Specifications of the PCT/US2013/065246, U.S. patent Ser. Nos. 14/368,721, 15/260,099, and U.S. patent application Ser. No. 15/813,866 Applications are hereby incorporated by reference.

FIELD

Embodiments of the present disclosure generally relate to the field of integrated circuits, and more particularly, to techniques and configurations for surface finishes of integrated circuit package substrates.

BACKGROUND

The input/output density of dies, such as processors, is continually increasing. In order to keep up with the increasing input/output densities the package substrates to which the dies are attached must also scale correspondingly. Under the current state of the art, a single surface finish is applied to both a die and a land side of a package substrate. The die side of a package substrate is the side on which a die attaches, while the land side of a package substrate attaches to a circuit board. The single surface finish may grow, or expand, laterally after application which may cause pad-to-pad bridging on the die side of the substrate if the pads are located too closely together. As a result, the expansion of the surface finish on the die side limits the scalability of the package substrate. The surface finish composition on the land side, however, may be dictated based upon considerations related to circuit board connection requirements. These considerations do not necessarily extend to the die side connection requirements; however, under the current state of the art the same surface finish is applied to both the die side and the land side of the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
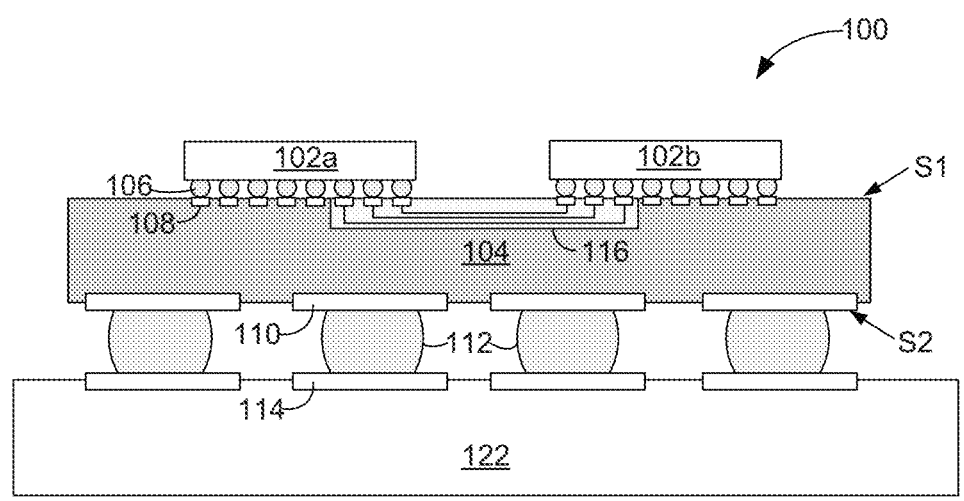
FIG. 1 schematically illustrates a cross-section side view of an example integrated circuit (IC) assembly, in accordance with some embodiments.

Embodiments of the present disclosure describe techniques and configurations for dual surface finish package substrate assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100 configured to use a dual surface finish on electrical routing features embedded in package substrate 104. In some embodiments, the IC assembly 100 may include one or more dies (e.g., dies 102a or 102b) electrically and/or physically coupled with package substrate 104, as can be seen. The package substrate 104 may further be electrically coupled with a circuit board 122, as can be seen. As used herein, the die side of a package substrate is the side on which the die attaches (e.g., side S1), while the land side of a package substrate is the side that attaches to the circuit board (e.g., side S2). In some embodiments, the IC assembly 100 may refer only to the package substrate 104.

According to various embodiments, a first surface finish may be disposed on electrical routing features, such as one or more lands, on side S2 of package substrate 104. A second surface finish may be disposed on electrical routing features of side S1 as described herein (e.g., surface finish 322 of FIG. 3). The second surface finish may be configured in the IC assembly 100 to route electrical signals of dies 102a and/or 102b through various components of the IC assembly 100. The electrical signals may include, for example, input/output (I/O) signals, radio frequency (RF) signals or power/ground associated with operation of dies 102a and/or 102b. This second surface finish may have a different chemical composition than the first surface finish. For example, while the first surface finish may be nickel-based, the second surface finish may, in some embodiments, be gold-based, such as that applied using a direct immersion gold (DIG) process.

Dies 102a and 102b can be attached to the package substrate 104 according to a variety of suitable configurations including, a flip-chip configuration, as depicted, or other configurations such as, for example, being embedded in the package substrate 104 or being configured in a wirebonding arrangement. In the flip-chip configuration, one or both of dies 102a or 102b may be attached to a surface of the package substrate 104 having the second surface finish using die interconnect structures 106 such as bumps, pillars, or other suitable structures that may also electrically couple dies 102a and 102b with the package substrate 104. This second surface finish may, as discussed further below, enable the die interconnect structures 106 to be spaced more closely together than would be possible using a single surface finish on both of sides S1 and S2 of package substrate 104 and thereby allow for increased input/output density.

Dies 102a or 102b may represent a discrete chip made from a semiconductor material and may be, include, or be a part of a processor, memory, or ASIC in some embodiments. In some embodiments, an electrically insulative material such as, for example, molding compound or underfill material (not pictured) may partially or fully encapsulate a portion of dies 102a or 102b and/or die interconnect structures 106. The die interconnect structures 106 may be configured to route the electrical signals between die 102a, die 102b, and/or the package substrate 104.

The package substrate 104 may include electrical routing features configured to route electrical signals to or from dies 102a and/or 102b. The electrical routing features may include, for example, traces disposed on one or more surfaces of the package substrate 104 and/or internal routing features such as, for example, trenches, vias or other interconnect structures to route electrical signals through the package substrate 104. In embodiments, electrical routing features may be embedded in one or more die interconnect regions 116. In embodiments, die interconnect region 116 may be a silicon patch. For example, in some embodiments, the package substrate 104 may include electrical routing features (such as die bond pads 108), having the second surface finish applied thereon, configured to receive the die interconnect structures 106 and route electrical signals through one or more electrically conductive lines embedded in die interconnect region 116, between die 102a, die 102b, and/or the package substrate 104.

In some embodiments, the package substrate 104 is an epoxy-based laminate substrate having a core (e.g., central core 304 of FIG. 3) and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of either of dies 102a or 102b through the circuit board 122. The circuit board 122 may be composed of other suitable materials in other embodiments. In some embodiments, the circuit board 122 is a motherboard (e.g., motherboard 502 of FIG. 5).

Package-level interconnects such as, for example, solder balls 112 may be coupled to one or more lands (hereinafter "lands 110") on the package substrate 104 and one or more pads 114 on the circuit board 122 to form corresponding solder joints that are configured to further route the electrical signals between the package substrate 104 and the circuit board 122. The solder balls 112 may be configured, for example, a in a ball-grid array (BGA) arrangement. In some embodiments, the lands 110 may have the first surface finish disposed thereon. The first surface finish may be comprised of any suitable electrically conductive material such as metal including, for example, nickel (Ni), palladium (Pd), gold (Au), silver (Ag), copper (Cu), or combinations thereof. Other suitable techniques to physically and/or electrically couple the package substrate 104 with the circuit board 122 may be used in other embodiments including, for example, land-grid array (LGA) structures and the like.

Figure 2:
FIG. 2 is an illustrative flow diagram of a package substrate fabrication process utilizing dual surface finish in accordance with an embodiment of the present disclosure.
Figure 3:
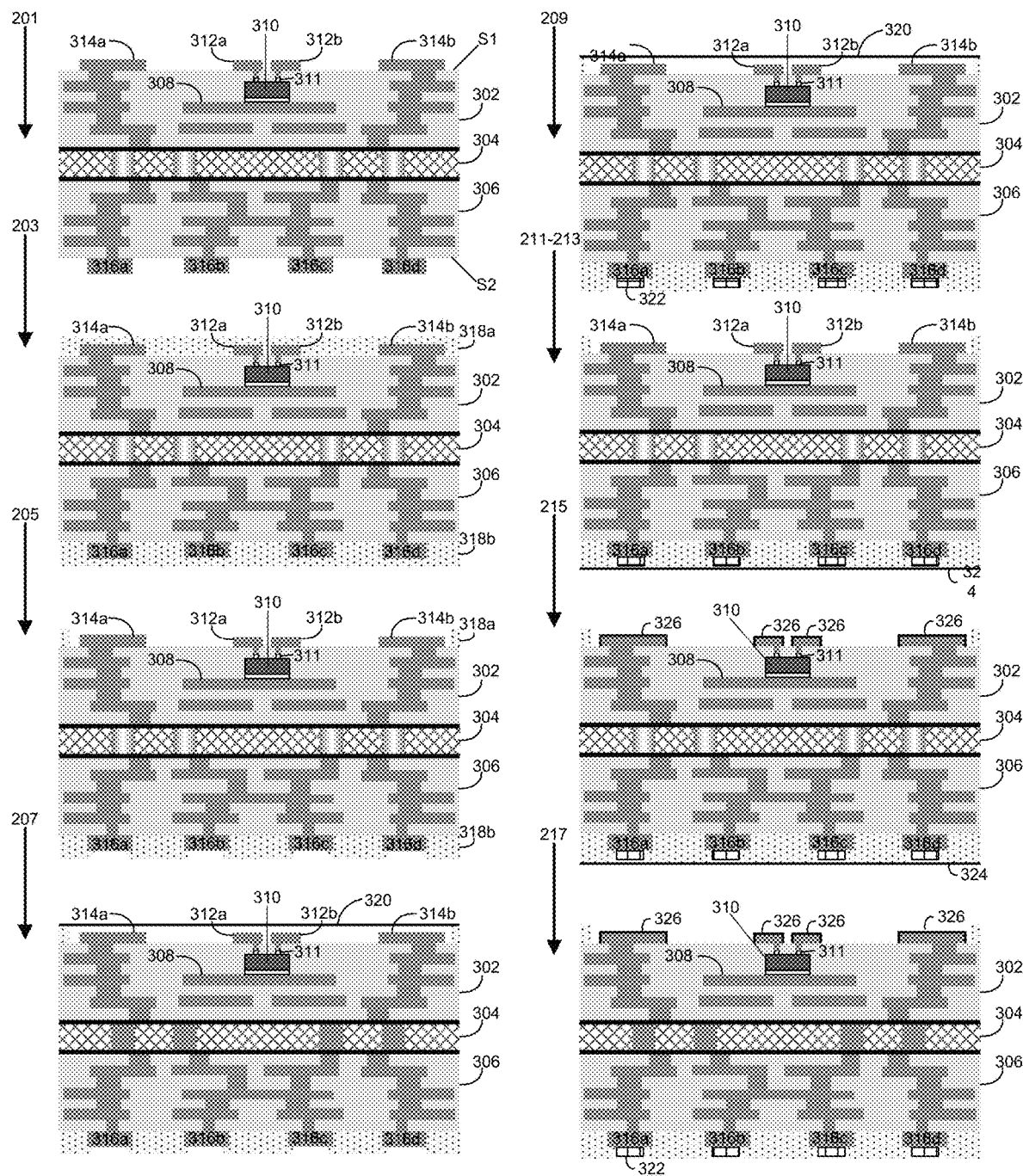
FIG. 3 is an illustrative cross-sectional view of selected operations illustrating stages in the package substrate fabrication process described in FIG. 2, in accordance with an embodiment of the present disclosure.

FIG. 2 is an illustrative flow diagram of a portion of a package substrate fabrication process 200 for applying a dual surface finish in accordance with an embodiment of the present disclosure. FIG. 3 provides cross-sectional views of selected operations illustrating stages in the package substrate fabrication process 200, in accordance with an illustrative embodiment. As a result, FIG. 2 and FIG. 3 will be described in conjunction with one another. To aid in this description, the operations performed in FIG. 2 are referenced on the arrows moving from operation to operation in FIG. 3. In addition, not all reference numbers are depicted in each operation in FIG. 3.

Package substrate fabrication process 200 may begin at operation 201 where a package substrate may be provided for application of dual surface finishes. The substrate provided may include a core (e.g., central core 304 of FIG. 3) having dielectric layers (e.g., dielectric layers 302 and 306 of FIG. 3) disposed thereon. The dielectric layers may have patterned metal layers (e.g., patterned metal layer 308 of FIG. 3) embedded therein. Generally, the patterned metal layer and any number of layers below the patterned metal layer may be formed in any manner known in the art. For example, the patterned metal layer may be a top build-up layer formed with a semi-additive process (SAP). The dielectric layer may be of any composition known in the art and may be applied over patterned sub-surface level metal layers in any conventional manner. For example, in some embodiments, the dielectric layer may comprise a polymer (epoxy-based resin) that may have a silica filler to provide suitable mechanical properties that meet reliability requirements of the package.

The substrate may have a die side (e.g., dies side S1 of FIG. 3) configured to have one or more dies disposed thereon (e.g., 102a and 102b of FIG. 1). In embodiments, the substrate may have one or more pads on which a die may be attached (e.g., 312a-b and 314a-b of FIG. 3). In embodiments, the pads may include copper or any other suitable electrically conductive material. The substrate may have one or more die interconnect regions embedded therein (e.g., die interconnect region 310 of FIG. 3). The die interconnect region may have one or more electrically conductive pads disposed thereon (e.g., copper pad 311 of FIG. 3). The pads of the die interconnect region may be electrically connected to surface level metal (e.g., pads 312a-b of FIG. 3). The die interconnect region may have electrically conductive lines (not depicted) embedded therein. The electrically conductive lines may establish an electrical connection between the electrically conductive pads disposed on the die interconnect region. In some embodiments, the die interconnect region may include silicon, such as a silicon patch or bridge.

The substrate may have a land side (e.g., land side S2 of FIG. 3) with one or more lands disposed thereon (e.g., lands 316a-d of FIG. 3). The land side may be configured to attach to one or more circuit boards via the one or more lands. A substrate such as that described above may be formed in any manner known in the art. For example, through a build-up process, such as a semi-additive process (SAP).

At operation 203, solder resist may be laminated on the die side and/or the land side of the package substrate (e.g., die side solder resist 318a and land side solder resist 318b of FIG. 3). Solder resist may be applied to protect against oxidation and to prevent pad to pad bridging. Solder resist may be applied through a silk-screening, spraying, or vacuum lamination process. The solder resist may be any suitable material including, but not limited to, liquid photoimageable solder mask (LPSM) and/or dry film photoimageable solder mask (DFSM).

After the solder resist has been applied solder resist openings may be formed at operation 205. The solder resist openings may be formed through photolithography or any other suitable process. The solder resist opening may be formed over surface level metal contacts to enable a surface finish to be applied to the surface level metal contacts. The openings may also be formed to enable attachment of a die to the package substrate (e.g., dies 102a-b of FIG. 1) via the die side surface level metal contacts or the package substrate to be attached to a circuit board (e.g., circuit board 122 of FIG. 1) via the land side surface level metal contacts.

At operation 207, a protective laminate (e.g., protective laminate 320 of FIG. 3) may be applied to the land side. The protective laminate may be any suitable material, such as, but not limited to polyethylene terephthalate (PET). The protective laminate may prevent deposition of a surface finish on the die side surface level metal contacts.

At operation 209, a first surface finish metal (e.g., surface finish 322 of FIG. 3) is formed on exposed surfaces of the surface level metal contacts (e.g., lands 316a-d of FIG. 3) exposed by formation of the solder resist openings. According to various embodiments, the first surface finish metal is of a different material composition than the lands. A variety of surface finish metal compositions or plated stacks may be employed. In the illustrative embodiment depicted in FIG. 3, an electroless plating process is used to form the surface finish 322 comprising any suitable electrically conductive material such as metal including, for example, nickel (Ni), palladium (Pd), gold (Au), silver (Ag), copper (Cu), and combinations thereof. In an illustrative embodiment, the surface finish 322 includes a 6-8 micron (µm) thick nickel layer.

At operation 211, the protective laminate on the die side (e.g., protective laminate 320 of FIG. 3) may be removed and at operation 213 a protective laminate (e.g., protective laminate 324 of FIG. 3) may be applied to the land side. The protective laminate on the land side may prevent deposition of a surface finish on the land side surface finish (e.g., surface finish 322 of FIG. 3).

At operation 215, a second surface finish (e.g., surface finish 326 of FIG. 3) may be formed on the exposed surfaces of the surface level metal contacts of the die side (e.g., pads 312a-b and 314a-b of FIG. 3). This second surface finish may be deposited through a process such as a direct immersion gold (DIG) process, an organic solderability preservative (OSP) process, and/or an electroless palladium immersion gold (EPIG) process. In embodiments, the second surface finish may have a different chemical composition than the first surface finish. In some embodiments, this second surface finish may be comprised of gold, palladium, and/or imidazole, or an imidazole derivative, such as, but not limited to, benzimidazole or phenylimidazole. In an illustrative embodiment, the second surface finish may be less than 0.5 µm, 500 nanometers (nm), thick. In OSP, DIG, or EPIG processes the second surface finish (e.g. surface finish 326) may range in thickness from 60 nm to 300 nm. At operation 217, the protective laminate on the land side (e.g., protective laminate 324 of FIG. 3) may be removed.

In some embodiments, the critical dimension (CD), or minimum lateral width, of a surface finish at a connection point may be at least as large as the largest diameter of a pad (e.g., pads 312a-b and 314a-b of FIG. 3); however, because the second surface finish may be less than 500 nm thick, the lateral expansion of the surface finish metal, on the die side pads, is reduced allowing a reduction in the space between adjacent pads. For example, where connection points have a pitch (e.g., bump pitch), this minimized lateral expansion of the surface finish may enable a 55 μm bump pitch or less where the pad size is 43 μm which would provide higher I/O routing density than is possible with the current state of the art.

While the above process describes application of the first surface finish to the land side followed by application of the second surface finish to the die side, this process may be performed in an opposite order as well. For example, the second surface finish may be applied to the die side of the package substrate followed by application of the first surface finish to the land side of the package substrate.

Figure 4:
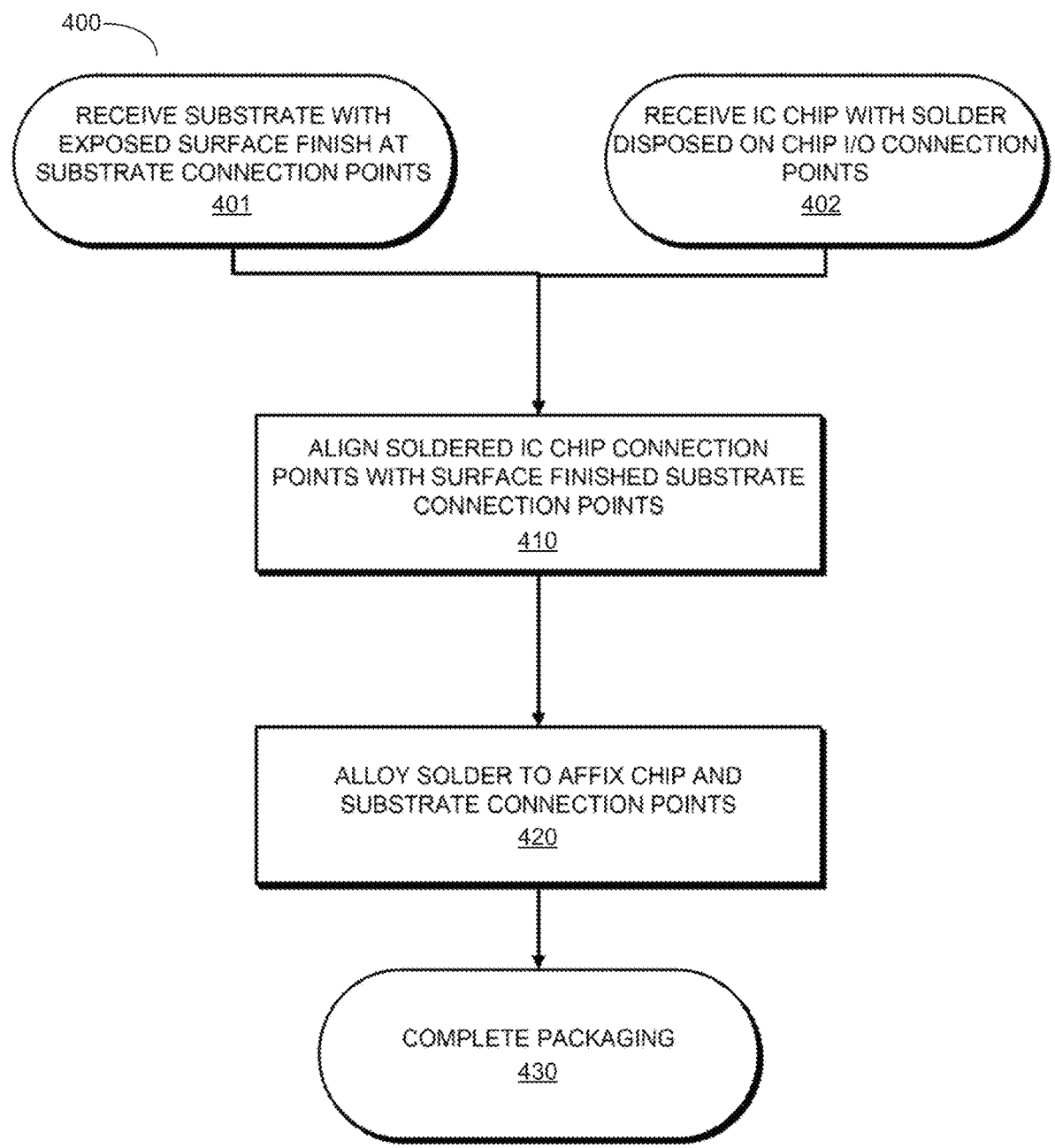
FIG. 4 is an illustrative flow diagram of an assembly process utilizing a package substrate with dual surface finish in accordance with an embodiment of the present disclosure.

FIG. 4 is an illustrative flow diagram of an assembly process 400 utilizing a package substrate with dual surface finish in accordance with an embodiment of the present disclosure. Such a package substrate may be produced through the illustrative method described in reference to FIG. 2, above, and may be depicted in FIG. 3.

Assembly process 400 begins at operation 401 with receiving a package substrate with exposed surface finish at predetermined substrate connection points. As such, in the illustrative embodiments, no solder resist is present on the surface of the package substrate and no solder is placed on the surface finish prior to coupling a chip to the package substrate. An illustrative package substrate may be depicted in FIG. 3.

At operation 402, an IC chip may be received with solder bumps disposed on the chip connection points. While the IC chip may generally be of any conventional type, in a particular embodiment, the IC chip may be a processor, such as a microprocessor, having a large I/O count. In an embodiment, the chip I/O and power solder bumps may have a pitch of 55 μm, as described above. At operation 410, the IC chip may be aligned with the surface finished substrate to have the soldered IC chip connection points aligned with the surface finished substrate connection points. The chip side solder is then alloyed at operation 420 to affix the chip to the substrate connection points which completes the packaging 430.

Figure 5:
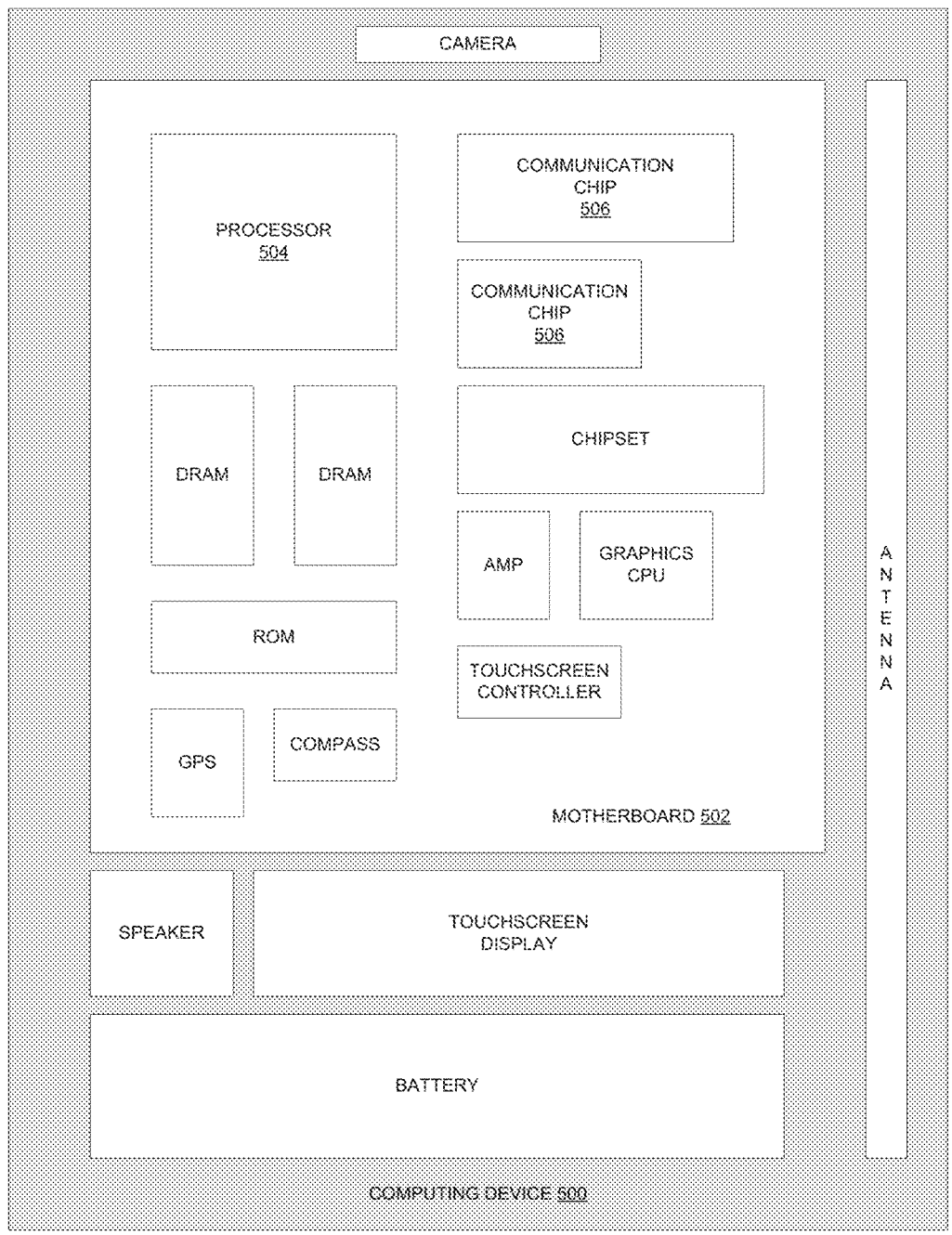
FIG. 5 schematically illustrates a computing device that includes a package substrate having a dual surface finish, in accordance with some embodiments.

Embodiments of the present disclosure may be implemented into a system using any suitable hardware and/or software to configure as desired. FIG. 5 schematically illustrates a computing device that includes a package substrate as described herein, such as that depicted by FIG. 3, in accordance with some embodiments. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 may be packaged in an IC assembly (e.g., IC assembly 100 of FIG. 1) that includes a package substrate as described herein. For example, the circuit board 122 of FIG. 1 may be a motherboard 502 and the processor 504 may be a die 102 mounted on a package substrate 104 as described herein. The package substrate 104 and the motherboard 502 may be coupled together using package-level interconnects as described herein. The term "processor" may refer to any device or portion of a device that processes electronic data from registers and/or memory to transform that electronic data into other electronic data that may be stored in registers and/or memory.

The communication chip 506 may also include a die (e.g., die 102 of FIG. 1) that may be packaged in an IC assembly (e.g., IC assembly 100 of FIG. 1) that includes a package substrate 104 as described herein. In further implementations, another component (e.g., memory device or other integrated circuit device) housed within the computing device 500 may include a die (e.g., die 102 of FIG. 1) that may be packaged in an IC assembly (e.g., IC assembly 100 of FIG. 1) that includes a package substrate 104 as described herein.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Examples

According to various embodiments, the present disclosure describes a number of examples. Example 1 is a method of forming an integrated circuit (IC) package substrate comprising: depositing a first lamination layer on a first side of the package substrate and a first surface finish on one or more electrical contacts disposed on a second side of the package substrate, wherein the first side is disposed opposite the second side and the first lamination layer is to prevent deposition of the first surface finish on one or more electrical contacts disposed on the first side; removing the first lamination layer from the first side of the package substrate to expose the one or more electrical contacts disposed on the first side; depositing a second lamination layer on the second side of the package substrate and a second surface finish on the one or more electrical contacts disposed on the first side of the package substrate, wherein the second lamination layer is to prevent deposition of the second surface finish on the one or more electrical contacts disposed on the second side; and removing the second lamination layer from the second side of the package substrate.

Example 2 may include the subject matter of Example 1, wherein the depositing of the first surface finish is accomplished by a Direct Immersion Gold (DIG) process and the one or more electrical contacts disposed on the second side comprise die bond pads.

Example 3 may include the subject matter of Example 1, wherein the depositing of the first surface finish is accomplished by an Electroless Palladium Immersion Gold (EPIG) process and the one or more electrical contacts disposed on the second side comprise die bond pads.

Example 4 may include the subject matter of Example 1, wherein the depositing of the first surface finish is accomplished by an Organic Solderability Preservative (OSP) process and the one or more electrical contacts disposed on the second side comprise die bond pads.

Example 5 may include the subject matter of any one of Examples 1-4, wherein depositing the second surface finish is accomplished using an electroless plating process and the one or more electrical contacts disposed on the second side comprise one or more lands.

Example 6 may include the subject matter of any one of Examples 1-4, wherein depositing the second surface finish comprises depositing nickel (Ni) and the one or more electrical contacts disposed on the second side comprise one or more lands.

Example 7 may include the subject matter of Example 6, wherein depositing the second surface finish further comprises depositing one or both of palladium or gold.

Example 8 may include the subject matter of Example 7, wherein depositing the second surface finish comprises depositing gold using an electroless nickel-immersion gold (ENIG+EG) process.

Example 9 is a package substrate comprising: a first side including one or more lands, the one or more lands having a first surface finish disposed on the one or more lands; and a second side disposed opposite to the first side, the second side having die interconnect region, the die interconnect region having one or more electrical routing features embedded therein, the one or more electrical routing features having a second surface finish disposed on, and in direct contact with, the one or more electrical routing features, wherein the electrical routing features are configured to bond with die interconnect structures of one or more dies and the second surface finish has a different chemical composition than the first surface finish.

Example 10 may include the subject matter of Example 9, wherein the first surface finish is an outermost surface finish on the one or more lands and the second surface finish is an outermost surface finish on the one or more electrical routing features.

Example 11 may include the subject matter of Example 9, wherein the second surface finish is imidazole or an imidazole derivative.

Example 12 may include the subject matter of Example 9, wherein the second surface finish is gold.

Example 13 may include the subject matter of Example 9, wherein the second surface finish is a combination of palladium and gold.

Example 14 may include the subject matter of Example 9, wherein the second surface finish has a thickness of less than or equal to 500 nanometers.

Example 15 may include the subject matter of Example 9, wherein the first surface finish comprises nickel (Ni).

Example 16 may include the subject matter of Example 15, wherein the first surface finish further comprises one or both of palladium (Pd) or gold (Au).

Example 17 may include the subject matter of Example 9, wherein the die interconnect region is disposed in a dielectric layer.

Example 18 may include the subject matter of Example 9, wherein the die interconnect region comprises a silicon bridge.

Example 19 may include the subject matter of Example 9, wherein the one or more electrical routing features of the die interconnect region route electrical signals between a first die connected to the package substrate and a second die connected to the package substrate.

Example 20 is a package assembly comprising: an integrated circuit (IC) chip having one or more input/output (I/O) connection points and one or more power connection points; and a package substrate including: a first side including one or more lands, the one or more lands having a first surface finish disposed on the one or more lands; and a second side disposed opposite to the first side, the second side having a silicon connecting region embedded therein, the silicon connecting region having one or more electrical routing features embedded therein, the one or more electrical routing features having a second surface finish disposed on, and in direct contact with, the one or more electrical routing features, wherein the second surface finish has a different chemical composition than the first surface finish and the second surface finish is electrically connected to the one or more I/O connection points or the one or more power connection points.

Example 21 may include the subject matter of Example 20, wherein the IC chip is a processor.

Example 22 may include the subject matter of Example 20, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder.

Example 23 is an apparatus for forming an integrated circuit (IC) package substrate comprising: means for depositing a first lamination layer on a first side of the package substrate and a first surface finish on one or more electrical contacts disposed on a second side of the package substrate, wherein the first side is disposed opposite the second side and the first lamination layer is to prevent deposition of the first surface finish on one or more electrical contacts disposed on the first side; means for removing the first lamination layer from the first side of the package substrate to expose the one or more electrical contacts disposed on the first side; means for depositing a second lamination layer on the second side of the package substrate and a second surface finish on the one or more electrical contacts disposed on the first side of the package substrate, wherein the second lamination layer is to prevent deposition of the second surface finish on the one or more electrical contacts disposed on the second side; and means for removing the second lamination layer from the second side of the package substrate.

Example 24 may include the subject matter of Example 23, wherein the means for depositing the first surface finish further comprises means for performing a Direct Immersion Gold (DIG) process and the one or more electrical contacts disposed on the second side comprise die bond pads.

Example 25 may include the subject matter of Example 23, wherein the means for depositing the first surface finish further comprise means for performing an Electroless Palladium Immersion Gold (EPIG) process and the one or more electrical contacts disposed on the second side comprise die bond pads.

Example 26 may include the subject matter of Example 23, wherein the means for depositing the first surface finish further comprise means for performing an Organic Solderability Preservative (OSP) process and the one or more electrical contacts disposed on the second side comprise die bond pads.

Example 27 may include the subject matter of any one of Examples 23-26, wherein the means for depositing the second surface finish further comprise means for performing an electroless plating process and the one or more electrical contacts disposed on the second side comprise one or more lands.

Example 28 may include the subject matter of any one of Examples 23-26, wherein the means for depositing the second surface finish further comprise means for depositing nickel (Ni) and the one or more electrical contacts disposed on the second side comprise one or more lands.

Example 29 may include the subject matter of Example 28, wherein the means for depositing the second surface finish further comprises means for depositing one or both of palladium or gold.

Example 30 may include the subject matter of Example 29, wherein means for depositing the second surface finish comprises means for depositing gold using an electroless nickel-immersion gold (ENIG+EG) process.

Example 31 may include the apparatus of 23, wherein the one or more electrical contacts disposed on the second side comprise die bond pads and the means for depositing the first surface finish further comprise one of: means for performing a Direct Immersion Gold (DIG) process, means for performing an Electroless Palladium Immersion Gold (EPIG) process, or means for performing an Organic Solderability Preservative (OSP) process.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method for providing a package substrate, comprising:
   providing one or more lands on a first side of the package substrate, the package substrate including a second side opposite the first side;
   disposing one or more die bond pads on the second side, including providing the one or more die bond pads in a die interconnect region of the package substrate, wherein the die interconnect region comprises a silicon bridge;
   depositing a first surface finish on at least one of the one or more lands; and
   depositing a second surface finish on at least one of the die bond pads;
   wherein the second surface finish has a different chemical composition than the first surface finish.

2. The method of claim 1, wherein disposing the die bond pads includes disposing at least one die bond pad on the silicon bridge.

3. The method of claim 1, wherein the first surface finish is an outermost surface finish on the one or more lands and the second surface finish is an outermost surface finish on the one or more die bond pads.

4. The method of claim 1, wherein the second surface finish is imidazole or an imidazole derivative.

5. The method of claim 1, wherein the second surface finish is gold (Au).

6. The method of claim 1, wherein the second surface finish is a combination of palladium (Pd) and gold (Au).

7. The method of claim 1, wherein the second surface finish has a thickness of less than or equal to 500 nanometers.

8. The method of claim 1, wherein the first surface finish comprises nickel (Ni).

9. The method of claim 8, wherein the first surface finish further comprises one or both of palladium (Pd) or gold (Au).

10. A method for providing an assembly, comprising:

disposing a silicon bridge in a substrate of the assembly;

disposing a plurality of lands on a first side of the substrate;

providing a plurality of die bond pads, including disposing at least one die bond pad on the silicon bridge and disposing at least one other die bond pad on a second side of the substrate, the second side of the substrate opposite the first side;

depositing a first surface finish on at least one of the lands;

depositing a second surface finish on at least one of the die bond pads, wherein the second surface finish has a different chemical composition than the first surface finish;

extending a first set of interconnect structures between a first die of the assembly and the die bond pads; and extending a second set of interconnect structures between a second die of the assembly and the die bond pads.

11. The method of claim 10, further comprising:

disposing routing features in the silicon bridge, to electrically couple the first die and the second die.

12. The method of claim 11, further comprising:

disposing routing features in the substrate, to electrically couple the first die and the second die.

13. The method of claim 10, wherein the first surface finish is an outermost surface finish on the one or more lands and the second surface finish is an outermost surface finish on the one or more die bond pads.

14. The method of claim 10, wherein the second surface finish is imidazole or an imidazole derivative.

15. The method of claim 10, wherein the second surface finish is gold (Au).

16. The method of claim 10, wherein the second surface finish is a combination of palladium (Pd) and gold (Au).

17. The method of claim 10, wherein the second surface finish has a thickness of less than or equal to 500 nanometers.

18. The method of claim 10, wherein the first surface finish comprises nickel (Ni).

19. The method of claim 18, wherein the first surface finish further comprises one or both of palladium (Pd) or gold (Au).

20. The method of claim 10, wherein the first and second dies comprise integrated circuits (IC).

* * * * *